US012136005B2

(12) United States Patent
Kaltiokallio

(10) Patent No.: US 12,136,005 B2
(45) Date of Patent: Nov. 5, 2024

(54) INTEGRATED CIRCUITS

(71) Applicant: Nokia Technologies Oy, Espoo (FI)

(72) Inventor: Kim Kaltiokallio, Helsinki (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 351 days.

(21) Appl. No.: 16/892,981

(22) Filed: Jun. 4, 2020

(65) Prior Publication Data

US 2020/0395053 A1 Dec. 17, 2020

(30) Foreign Application Priority Data

Jun. 12, 2019 (EP) ..................................... 19179656

(51) Int. Cl.
| | |
|---|---|
| *G06G 7/16* | (2006.01) |
| *G06F 7/544* | (2006.01) |
| *G11C 7/10* | (2006.01) |
| *H10N 70/00* | (2023.01) |

(52) U.S. Cl.
CPC ............. *G06G 7/16* (2013.01); *G06F 7/5443* (2013.01); *G11C 7/1006* (2013.01); *H10N 70/023* (2023.02)

(58) Field of Classification Search
CPC .................................. G06G 7/12; G06G 7/16
See application file for complete search history.

(56) References Cited

U.S. PATENT DOCUMENTS

| | | | |
|---|---|---|---|
| 8,537,043 B1* | 9/2013 | McLachlan | .......... H03K 17/063 375/232 |
| 2002/0109230 A1 | 8/2002 | Woodbury et al. | |
| 2008/0094168 A1* | 4/2008 | Hynes | ................. H01L 23/5228 338/257 |
| 2010/0149852 A1 | 6/2010 | Dimitrijev et al. | |
| 2011/0103131 A1 | 5/2011 | Katayama et al. | |
| 2011/0140757 A1 | 6/2011 | Mallinson | |

(Continued)

OTHER PUBLICATIONS

Feng Y, Huang P, Zhou Z, Ding X, Liu L, Liu X, Kang J. Negative Differential Resistance Effect in Ru-Based RRAM Device Fabricated by Atomic Layer Deposition. Nanoscale Res Lett. Mar. 11, 2019;14(1):86. doi: 10.1186/s11671-019-2885-2. PMID: 30859337; PMCID: PMC6411786. (Year: 2019).*

(Continued)

*Primary Examiner* — Andrew Caldwell
*Assistant Examiner* — Carlo Waje
(74) *Attorney, Agent, or Firm* — ALSTON & BIRD LLP

(57) ABSTRACT

An apparatus is disclosed, comprising means for providing in an integrated circuit a resistive network comprising a first resistance element having a first resistance value and a second resistance element having a second resistance value, each resistance element of the resistive network being provided by one or more high-resistance contacts between conductors of the integrated circuit. The apparatus may also provide a means for providing in the integrated circuit an electrical current from the resistive network to one of a summing node output and a subtraction node output for input to a corresponding summing node input and a subtraction node input of a signal processing component. A method for forming such an integrated circuit is also disclosed.

20 Claims, 14 Drawing Sheets

(56) References Cited

U.S. PATENT DOCUMENTS

| | | | |
|---|---|---|---|
| 2012/0133538 A1* | 5/2012 | Choi | G11C 13/0002 341/154 |
| 2013/0335248 A1 | 12/2013 | Iadanza | |
| 2015/0302912 A1* | 10/2015 | Kim | G11C 11/1673 365/158 |
| 2016/0049913 A1* | 2/2016 | Jussila | H04B 1/0032 338/200 |
| 2016/0379695 A1* | 12/2016 | Kulkarni | G11C 11/1673 365/158 |
| 2018/0095930 A1 | 4/2018 | Lu et al. | |
| 2019/0108193 A1 | 4/2019 | Buchanan | |
| 2020/0395053 A1* | 12/2020 | Kaltiokallio | G06F 7/5443 |
| 2020/0401206 A1* | 12/2020 | Kallam | G06F 7/5443 |

OTHER PUBLICATIONS

Anonymous, "Reset" Definition, https://web.archive.org/web/20131225112157/https://www.merriam-webster.com/dictionary/reset ( Year: 2013).*

Office action received for corresponding European Patent Application No. 19179656.4, dated May 6, 2022, 5 pages.

Fahimi et al., "Mixed-Signal Computing with Non-Volatile Memories", SRC Technical Conference, 2018, 4 pages.

Nair, "Memristive Crossbar Arrays for Machine Learning Systems", Thesis, 2015, 105 pages.

Parthasarathy et al., "A 16-bit Resistor String DAC with Full-Calibration at Final Test", IEEE International Conference on Test, 2005, pp. 1-10.

"Memristor", Wikipedia, Retrieved on Jun. 8, 2020, Webpage available at : https://en.wikipedia.org/wiki/Memristor.

Mittal, "A Survey of ReRAM-Based Architectures for Processing-In-Memory and Neural Networks", Machine Learning and Knowledge Extraction, vol. 1, No. 1, 2019, pp. 75-114.

Zidan et al., "Field-Programmable Crossbar Array (FPCA) for Reconfigurable Computing", IEEE Transactions on Multi-Scale Computing Systems, vol. 4, No. 4, Oct.-Dec. 1, 2018, pp. 698-710.

Vianello et al., "Metal Oxide Resistive Memory (OxRAM) and Phase Change Memory (PCM) as Artificial Synapses in Spiking Neural Networks", 25th IEEE International Conference on Electronics, Circuits and Systems (ICECS), Dec. 9-12, 2018, pp. 561-564.

Pan et al., "A Multilevel Cell STT-MRAM-Based Computing In-Memory Accelerator for Binary Convolutional Neural Network", IEEE Transactions on Magnetics, vol. 54, No. 11, Nov. 2018, 5 pages.

Lin et al., "A Novel Voltage-Accumulation Vector-Matrix Multiplication Architecture Using Resistor-shunted Floating Gate Flash Memory Device for Low-power and High-density Neural Network Applications", IEEE International Electron Devices Meeting (IEDM), Dec. 1-5, 2018, pp. 39-42.

Extended European Search Report received for corresponding European Patent Application No. 19179656.4, dated Dec. 3, 2019, 8 pages.

"DAC7821 12-Bit, Parallel Input, Multiplying Digital-to-Analog Converter", Burr-Brown Products from Texas Instruments, Jul. 1, 2007, 23 pages.

Ramakrishna et al., "Design of Low Power IOGS/s 6-Bit DAC using CMOS Technology", International Journal of Engineering & Technology, vol. 7, No. 1.5, 2018, pp. 226-229.

Walt, "MT-015 Tutorial Basic DAC Architectures II: Binary DACs", Analog Devices, 2009, pp. 1-10.

Lai et al., "Atomic Layer Deposition Stacked Tantalum Nitride Thin Film Resistor", ECS—The Electrochemical Society Meeting Abstracts, vol. MA2005-02, 2005, 1 page.

Office Action for European Application No. 19179656.4 dated Sep. 21, 2022, 6 pages.

Decision to Grant for European Application No. 19179656.4 dated Sep. 19, 2023, 8 pages.

* cited by examiner

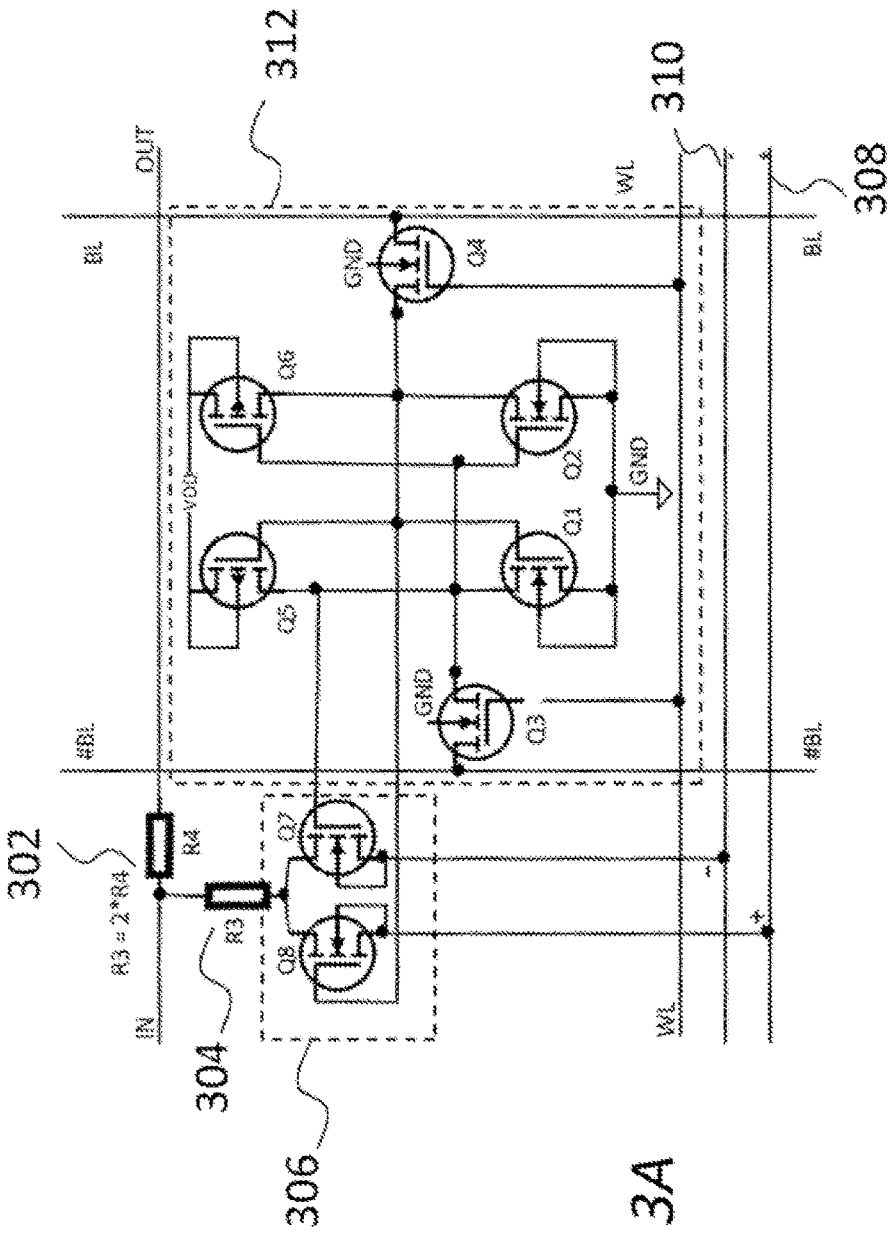
FIG. 3A
FIG. 3B

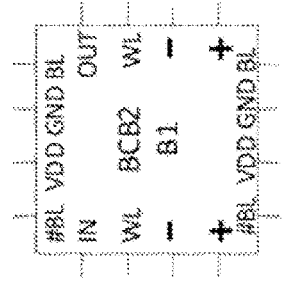
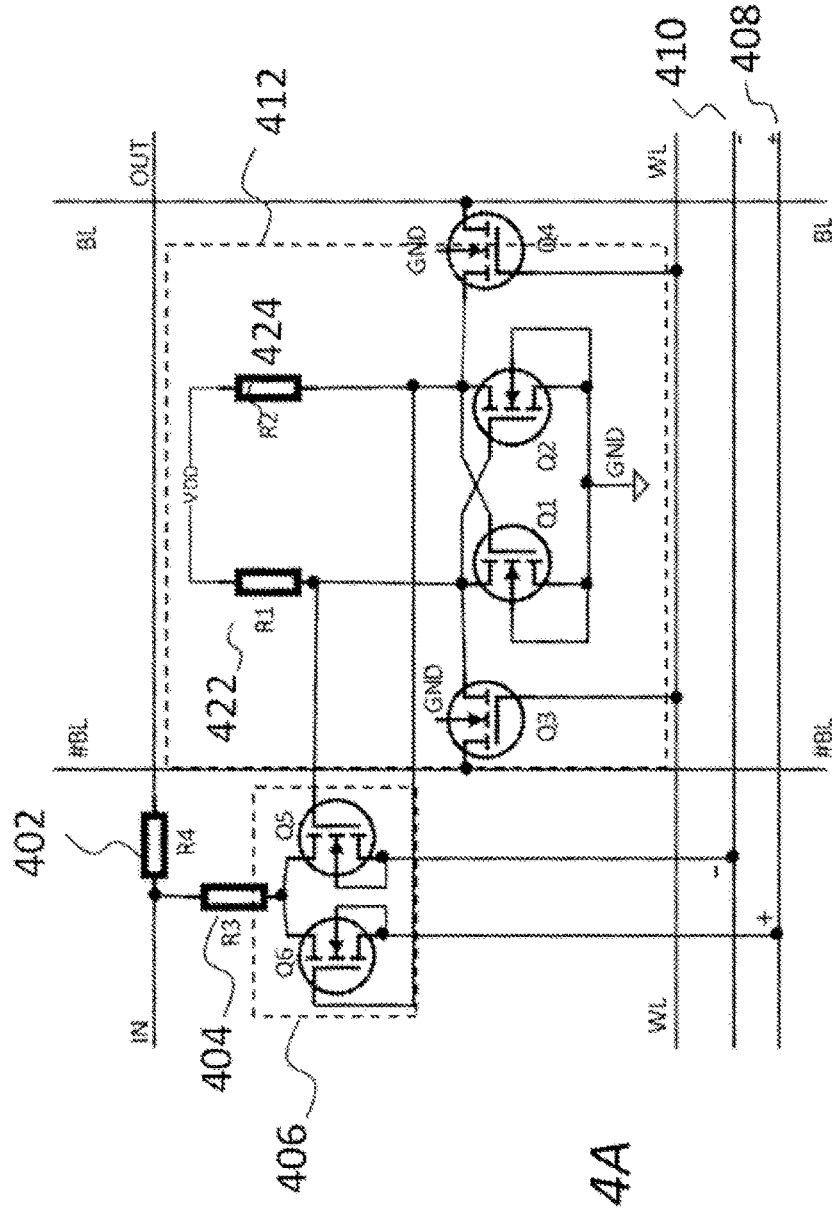
FIG. 4A
FIG. 4B

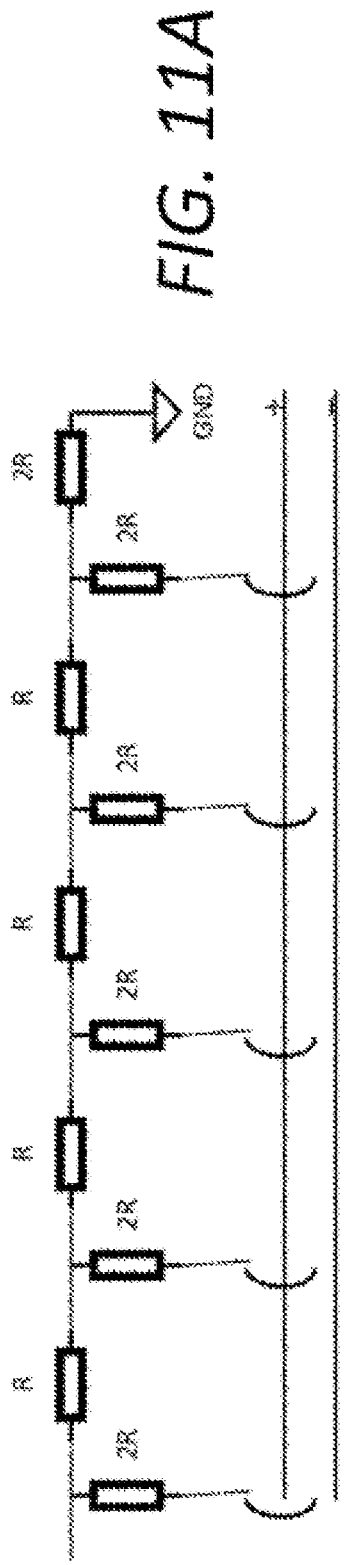
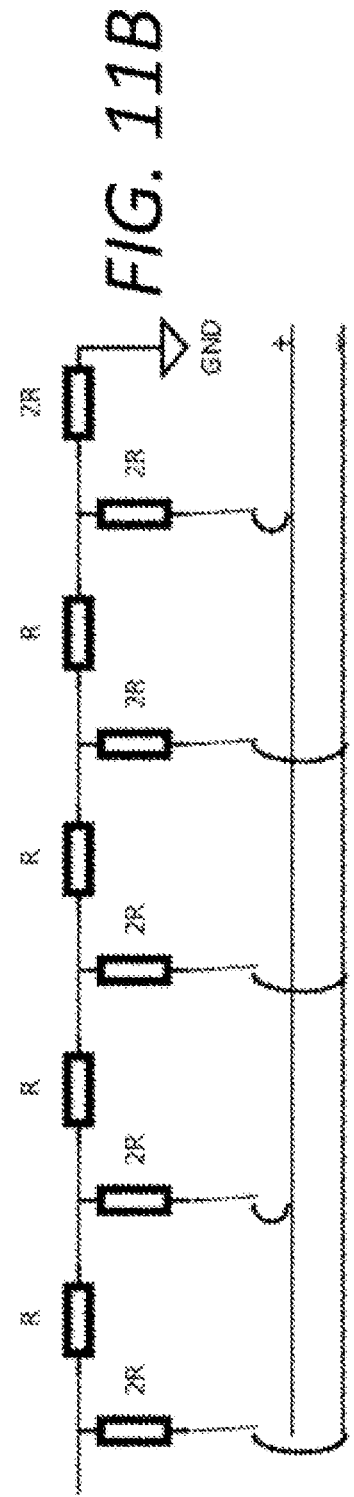

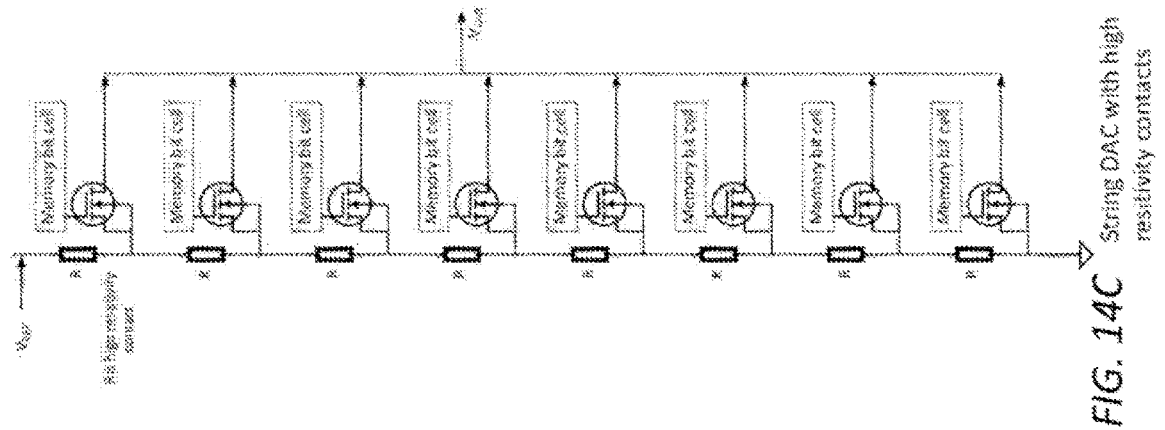
FIG. 14C String DAC with high resistivity contacts
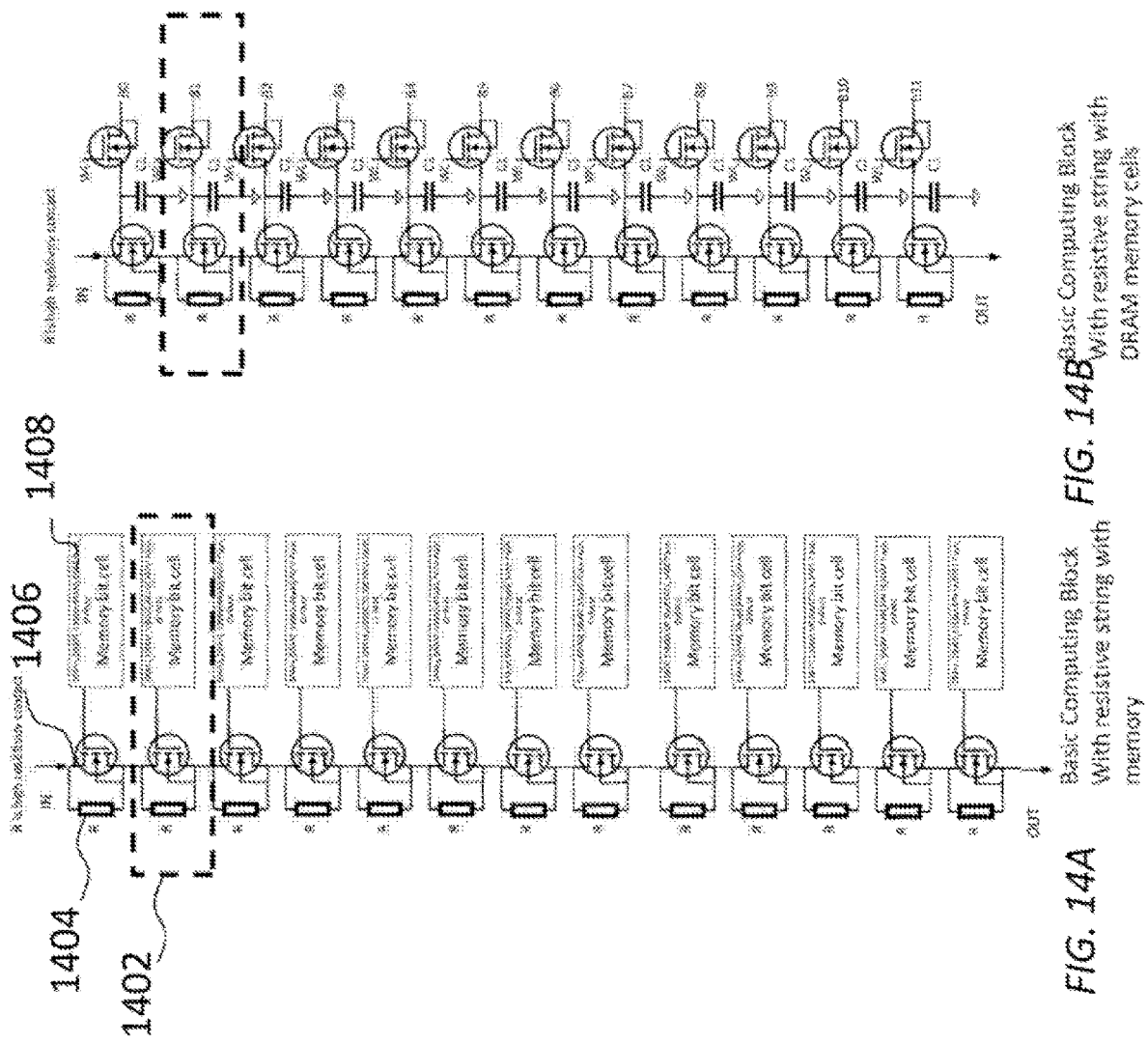
FIG. 14B Basic Computing Block with resistive string with DRAM memory cells
FIG. 14A Basic Computing Block with resistive string with memory

INTEGRATED CIRCUITS

FIELD

Example embodiments relate to integrated circuits, for example integrated circuits useful for computing-in-memory (CIP.)

BACKGROUND

Integrated Circuits (ICs) are widespread in modern electronics and may be used to implement a wide range of processing and memory devices. Computing-in-Memory (CIM) technology is a developing area which aims to provide improvements in computational performance. Traditional systems tend to store data as electrical charges on a memory that is separate from the processor which performs tasks such as arithmetic and logic functions. With the increase in data required for certain applications, such as with neural network processing, data movement between the processor and memory may present one of the more critical performance and energy bottlenecks. CIM typically involves the use of new memory technologies which are also able to perform certain computational tasks such as the arithmetic and/or logical functions. For example ReRAM (Resistive Random-Access Memory), PCM (Phase-Change Memory), MRAM (Magnetic Random-Access Memory) are examples of relatively new memory technologies which may offer certain advantages for CIM implementations.

SUMMARY

The scope of protection sought for various embodiments of the invention is set out by the independent claims. The embodiments and features, if any, described in this specification that do not fall under the scope of the independent claims are to be interpreted as examples useful for understanding various embodiments of the invention.

According to an example embodiment, there is provided an apparatus, comprising means: for providing in an integrated circuit a resistive network comprising a first resistance element having a first resistance value and a second resistance element having a second resistance value, each resistance element of the resistive network being provided by one or more high-resistance contacts between conductors of the integrated circuit; and for providing in the integrated circuit an electrical current from the resistive network to one of a summing node output and a subtraction node output for input to a corresponding summing node input and a subtraction node input of a signal processing component.

The resistive network may be configured as a current or voltage divider.

Each resistance element may be comprised of one or more resistive contacts formed by atomic layer deposition (ALD) of material to provide the one or more high-resistance contacts between the conductors.

The second resistance value may be substantially an integer multiple of the first resistance value. The second resistance value may be substantially twice that of the first resistance value.

The high-resistance contacts may have substantially the same resistance value, the first resistance element comprising two or more high-resistance contacts connected in parallel to provide the same resistance as one high-resistance contact forming the second resistor unit.

The apparatus may further comprise: means on the integrated circuit for storing an electrical signal representing at least one control bit; and means for routing the electrical current from the resistive network to one of the summing node output and the subtraction node output based on the value of the at least one control bit.

The storing means may comprise one of an SRAM, DRAM, MRAM, RRAM, FRAM, NVM flash, or OxRAM memory cell implemented on the integrated circuit.

The routing means may comprise a semiconductor switch comprising first and second transistors, the value of the control bit stored in the storing means determining the state of the semiconductor switch.

According to another example embodiment, there may be provided a system, comprising: a plurality of apparatuses described above connected in series such that the current dividers are connected to provide a resistor ladder and wherein each storing means is configured to receive as input a respective control bit.

In some embodiments, the system may further comprise an analogue signal processing component having a summing node input and a subtraction node input for receiving the routed electrical currents from the respective summing node outputs and subtraction node outputs of the series-connected apparatuses to provide at least a multiplier function.

The signal processing component may be an analogue signal processing component, e.g. an operational amplifier.

The system may be arranged to implement at least part of a neural network in which the control bits stored by the storage means of the series-connected apparatuses represent multiplier coefficients.

According to another example embodiment, there may be provided a method, comprising: providing in an integrated circuit a resistive network comprising a first resistance element having a first resistance value and a second resistance element having a second resistance value, each resistance element of the resistive network being provided by one or more high-resistance contacts between conductors of the integrated circuit; and providing in the integrated circuit an electrical current from the resistive network to one of a summing node output and a subtraction node output for input to a corresponding summing node input and a subtraction node input of a signal processing component.

The first and second resistance elements may be provided by an atomic deposition layer (ADL) technique between the two conductors which are provided as conductive layers of the integrated circuit.

The method may provide the resistive network as a current divider. The provided second resistance value may be substantially an integer multiple of the first resistance value. The provided second resistance value may be substantially twice that of the first resistance value.

The provided high-resistance contacts may have substantially the same resistance value, the first resistance element comprising two or more high-resistance contacts connected in parallel to provide the same resistance as one high-resistance contact forming the second resistor unit. The method may further comprise providing a means on the integrated circuit for storing an electrical signal representing at least one control bit; and providing a means for routing the electrical current from the resistive network to one of the summing node output and the subtraction node output based on the value of the at least one control bit.

The provided storing means may comprise one of an SRAM, DRAM, MRAM, RRAM, FRAM, NVM flash, or OxRAM memory cell implemented on the integrated circuit.

The provided routing means may comprise a semiconductor switch comprising first and second transistors, the value of the control bit stored in the storing means determining the state of the semiconductor switch.

According to another example embodiment, there may be provided a method comprising providing a plurality of such resistor networks connected in series such that the current dividers are connected to provide a resistor ladder and wherein a plurality of storing means are provided for receiving respective control bits.

In some embodiments, the method may further comprise providing an analogue signal processing component having a summing node input and a subtraction node input for receiving the routed electrical currents from the respective summing node outputs and subtraction node outputs of the series-connected apparatuses to provide at least a multiplier function. The provided signal processing component may be an analogue signal processing component, e.g. an operational amplifier.

The provided integrated circuit may be arranged to implement at least part of a neural network in which the control bits stored by the storage means of the series-connected apparatuses represent multiplier coefficients.

Providing may comprise fabricating using known or future integrated circuit fabricating techniques.

According to another example embodiment, there may be provided an integrated circuit comprising a resistive network comprised of a first resistance element having a first resistance value and a second resistance element having a second resistance value, each resistance element of the resistive network being provided by one or more high-resistance contacts between conductors of the integrated circuit; and routing circuitry configured to route an electrical current from the resistive network to one of a summing node output and a subtraction node output for input to a corresponding summing node input and a subtraction node input of a signal processing component.

According to another example embodiment, there may be provided a non-transitory computer readable medium comprising program instructions stored thereon for performing a method, comprising: providing in an integrated circuit a resistive network comprising a first resistance element having a first resistance value and a second resistance element having a second resistance value, each resistance element of the resistive network being provided by one or more high-resistance contacts between conductors of the integrated circuit; and providing in the integrated circuit routing circuitry to route an electrical current from the resistive network to one of a summing node output and a subtraction node output for input to a corresponding summing node input and a subtraction node input of a signal processing component.

According to another example embodiment, there may be provided an apparatus comprising: at least one processor; and at least one memory including computer program code which, when executed by the at least one processor, causes the apparatus: to providing in an integrated circuit a resistive network comprising a first resistance element having a first resistance value and a second resistance element having a second resistance value, each resistance element of the resistive network being provided by one or more high-resistance contacts between conductors of the integrated circuit; and providing in the integrated circuit an electrical current from the resistive network to one of a summing node output and a subtraction node output for input to a corresponding summing node input and a subtraction node input of a signal processing component.

BRIEF DESCRIPTION OF THE DRAWINGS

Example embodiments will now be described, by way of non-limiting example, with reference to the accompanying drawings, in which.

FIG. 3A is a schematic view of a basic computing element implemented using SRAM according to some example embodiments;

FIG. 3B is a pin or terminal diagram corresponding to the basic computing element shown in FIG. 3A;

FIG. 4A is a schematic view of a basic computing element implemented using a different form of SRAM according to some example embodiments;

FIG. 4B is a pin or terminal diagram corresponding to the basic computing element shown in FIG. 4A;

FIGS. 11A and 11B are, respectively, schematic views of different neural network topologies that may implemented according to some example embodiments;

FIGS. 14A-14C are schematic views of a plurality of series-connected basic computing elements in which a plurality resistors are arranged as a string providing voltage division.

DETAILED DESCRIPTION

Figure 1:
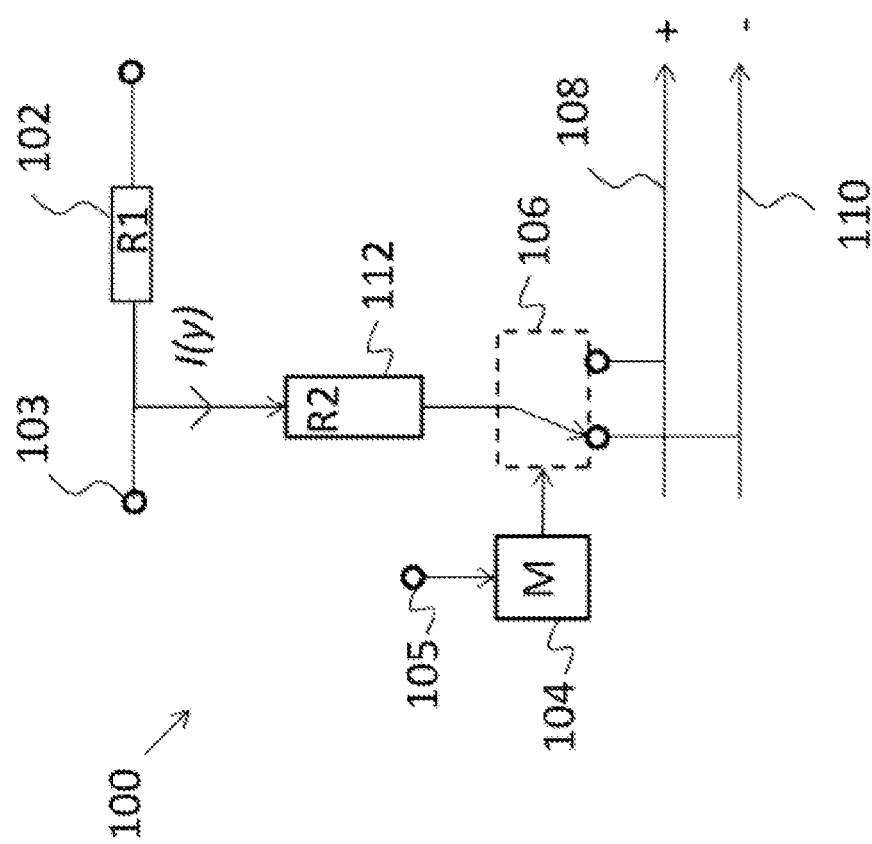
FIG. 1 is a schematic view of a basic computing element according to some example embodiments.

The following abbreviations may be referred to herein:
ADC Analog Digital converter;

ALD Atomic Layer Deposition;
ASIC Application Specific Integrated Circuit;
CMOS Complementary Metal Oxide Semiconductor;
DAC Digital to Analog Converter;
DCT Discrete Cosine Transform;
DFT Discrete Fourier Transform;
DRAM Dynamic Random-Access Memory;
FeRAM/FRAM Ferromagnetic Random-Access Memory;
GPU Graphic Processing Unit;
MCU Micro Computing Unit;
MRAM Magnetoresitive Random Access Memory;
NVM Flash Non-volatile Memory Flash
OxRAM Oxide based Random Access Memory;
ReRAM/RRAM Resistive Random-Access Memory;
SRAM Static Random-Access Memory; and
TMO Transition Metal Oxide.

Example embodiments relate to integrated circuits (ICs) and integrated circuit fabrication technologies and methodologies which may be applicable to Compute-in-Memory (CIM) technology. CIM technology is sometimes also referred to as Processing-in-Memory (PIM), although we shall herein refer only to CIM for ease of explanation.

Example embodiments relate to the formation of an IC comprising one or more resistor networks comprising a first resistance element having a first resistance value and a second resistance element having a second resistance value. Each resistance element of the resistive network may be provided by one or more resistive contacts between conductors of the IC, e.g. as via contact between metal layers, and for providing in the IC an electrical current from the resistive network to one of a summing node output and a subtraction node output for input to a corresponding summing node input and a subtraction node input of a signal processing component.

The one or more resistive contacts may be high-resistance contacts. By "high-resistance" is meant that the resistive contacts have a resistance value that is higher, e.g. much higher, than the on-resistance of switching transistors. For example, in very low power applications, the resistance value may be in the order of Mega ohms, whereas in high speed applications, the resistance value may be in the order of kilo ohms. Typical values may be substantially 10 Kilo ohms and above.

The resistive network may be configured as a current divider, and multiple current dividers may be provided in series, for example to form a voltage ladder architecture.

Each resistance element may be comprised of one or more resistive contacts formed by atomic layer deposition (ALD) to provide the one or more high-resistance contacts between the conductors. ALD is a thin-film deposition technique based on the use of a chemical vapour deposition. In basic terms, a film is grown on a substrate by exposing the substrate to so-called precursor gases in a sequential way that enables accurate control of the film growth and structure. Forming a resistive network using ALD enables at least part of a basic computing element to be formed in a very area and cost-efficient way, because the resistive contacts can be packed in a very dense way and the resistance values determined, for example, based on the cross-sectional area and height of the resistive contacts, assuming the resistors are grown in a vertical way between conductors (e.g. metal layers) in the manner of three-dimensional structures such as nanostructures.

The second resistance value may be substantially an integer multiple of the first resistance value. For example, the second resistance value may be substantially twice that of the first resistance value, thereby to enable formation of the known R-2R ladder topology that may be used in applications such as digital to analogue conversion and/or multiplication. The high-resistance contacts may have substantially the same resistance value, the first resistance element comprising two or more high-resistance contacts connected in parallel to provide the same resistance as one high-resistance contact forming the second resistor unit. By providing all contacts with the same resistance value makes fabrication straightforward, enabling good matching between different R and 2R resistor contacts to be achieved.

Example embodiments may also provide a means on the IC for storing an electrical signal representing at least one control bit and means for routing the electrical current from the resistive network to one of the summing node output and the subtraction node output based on the value of the at least one control bit.

The storage means may be implemented using current memory technologies but may also be implemented with newer and future memory technologies when such technologies become mature and competitive. Advantages offered by example embodiments herein may include improved memory speed, endurance, reliability, and write energy, even over certain emerging memory technologies.

Example embodiments may therefore provide what is termed herein a basic computing element which may, in addition to a resistive network, comprise a storage means such as a memory cell for storing the at least one control bit, e.g. a high or low value that may be interpreted as such, and there may be an associated switch that determines, based on the control bit, whether the electrical current that flows from part of the resistive network is provided to a summing or subtraction output which can be connected, for example, to an analogue component such as an operational amplifier or integrating operational amplifier having corresponding summing and subtracting inputs. Therefore, multiplication and other arithmetic functions may be performed in the analogue domain.

Thus, in a ladder network comprised of multiple such basic computing elements connected in series, the values of the binary control bits stored in the memory cells may determine the contribution of the current provided to summing or subtracting inputs of an analogue signal processing component. Therefore, what is described may be considered a mixed-signal architecture which may act as a programmable multiplier, the multiplier coefficient being the control bits, and which may also perform addition and subtraction through the analogue component. Division may also be accomplished by use of the resistor network.

In example embodiments, the structure of each basic computing element is relatively simple and may be very area and cost-efficient. Multiplication may be achieved using only the resistor means and addition and subtraction makes use of the analogue component, such as an operational amplifier. Using a mixed-signal architecture offers further advantages in that, for addition and subtraction at least, there are no rail-to-rail switching gates. Further, many signals are ordinarily analogue in many systems, e.g. camera sensor pixels, radio signals, speech/audio signals, etc., and signal processing may be done in such mixed-signal domains using one or more basic computing elements described herein.

Basic computing elements described herein may also be used for applications such as matrix calculations, Digital Fourier Transform (DFT) Conversions, Fast Fourier Transform (FFT) Conversions, Discrete Cosine Transform (DCT) conversions and in any application where multiplication, accumulation and/or subtraction operations are needed. The technology described herein developed for ultra-high density R2R networks can be used also in DACs and successive approximation ratio (SAR) ADCs so that the area efficiency in such converters may be very high.

Example embodiments provide a means to perform computational tasks involving CIM architectures where the memory element itself can hold, for example, the operand value and perform a calculation.

Basic Computing Element

FIG. 1 is a schematic view of a basic computing element 100 according to some example embodiments. The basic computing element 100 may comprise a first resistance means 102 and a second resistance means 112 arranged as a current divider, typically with the second resistance means having a resistance that is an integer multiple of that of the first resistor, e.g. R2=2R1. A current divider is a circuit that performs current division, i.e. an output current that is a fraction of its input current. Incoming current I(y) from an input terminal 103 may be divided through R1 and R2; that which goes through R2 goes to virtual ground and that which goes through R1 sees an equivalent impedance which is the same as R2 to virtual ground. The first and second resistance means 102, 112 may be formed by ALD techniques to provide three-dimensional/vertically grown resistive contacts extending between metal layers, and multiple metal layers may be employed for different conductive paths. An input signal may be applied at an input terminal 103 with a current I(y) flowing through the second resistance means 112 being useful for multiplication by virtue of Ohms Law whereby the voltage U(x,y) across the second resistance means is given by:

$$U(x,y)=R(x)*I(y).$$

The basic computing element 100 may also comprise a memory means, such as a memory cell 104 for storing at least one bit of data representative of a control bit. The memory cell 104 may be set or reset via a memory write node 105.

The control bit stored by the memory cell 104 may determine whether the opposite terminal of the second resistor 112 is connected to either a summing node/bus 108 or a subtraction node/bus 110. This may be by means of the memory cell 104 being connected to a routing means or switch 106. In this way, addition and subtraction may also be performed, and binary division of the current may be performed also using the first resistance means 102 when chained to further basic computing elements 100.

The memory cell 104 may comprise any one of a flip-flop, SRAM, DRAM, MRAM, RRAM, 1T FRAM, NVM flash, OxRAM memory cell, or similar, which may be implemented on the same IC as the first and second resistors 102, 112. The routing means or switch 106 may be provided by one or more transistors, which may be Field Effect Transistors (FETs,) which can be of the same type (both n or p-type) or may be of different types, for example to minimize switch resistance. For example, NMOS and PMOS transistor pairs (in CMOS) may be used for each switch 106. Again, the FETs providing the routing means or switch 106 may be implemented on the same IC as the first and second resistance means 102, 112.

As described previously, the first and second resistance means 102, 112 may be implemented using high-resistivity contacts between metal layers of the IC so that the resistor is formed in a vertical orientation, e.g. as a three-dimensional nanostructure. In some example embodiments, the aim is to maximize the resistance values for stability reasons, or at least attain a predetermined higher resistance value in the order of 10 kohms and above. This kind of vertical implementation may only occupy the surface area of one contact, and so may be only in the order of a hundred square nanometres or thereabouts. Using ALD enables excellent control of the growth process. In some embodiments, the length of the second resistance means 112 may be twice that of the first resistance means 102 (where the second resistance means has twice the resistance value of the first resistance means) or, in other embodiments, the first resistance means may be formed of two resistive contacts that are identical in resistance and structure to the second resistance means, but connected in parallel to achieve the R-2R ratio.

Thus, by means of using high-resistivity contact between metal layers, or possibly the use of multiple metal layers, an IC may be provided that incorporates at least the first and second resistance means 102, 112 and at a very high integration density, for example if ALD is employed.

The memory cell 104 which stores the control bit may in practice occupy most of the IC's area; this means that the implementation density of the basic computing element 100 may be close to that of the memory cell which requires no substantial change in area to the memory technology selected for the memory cell. SRAM memory cells may provide the lowest density, with DRAM, RRAM and MRAM providing better densities.

Figure 2:
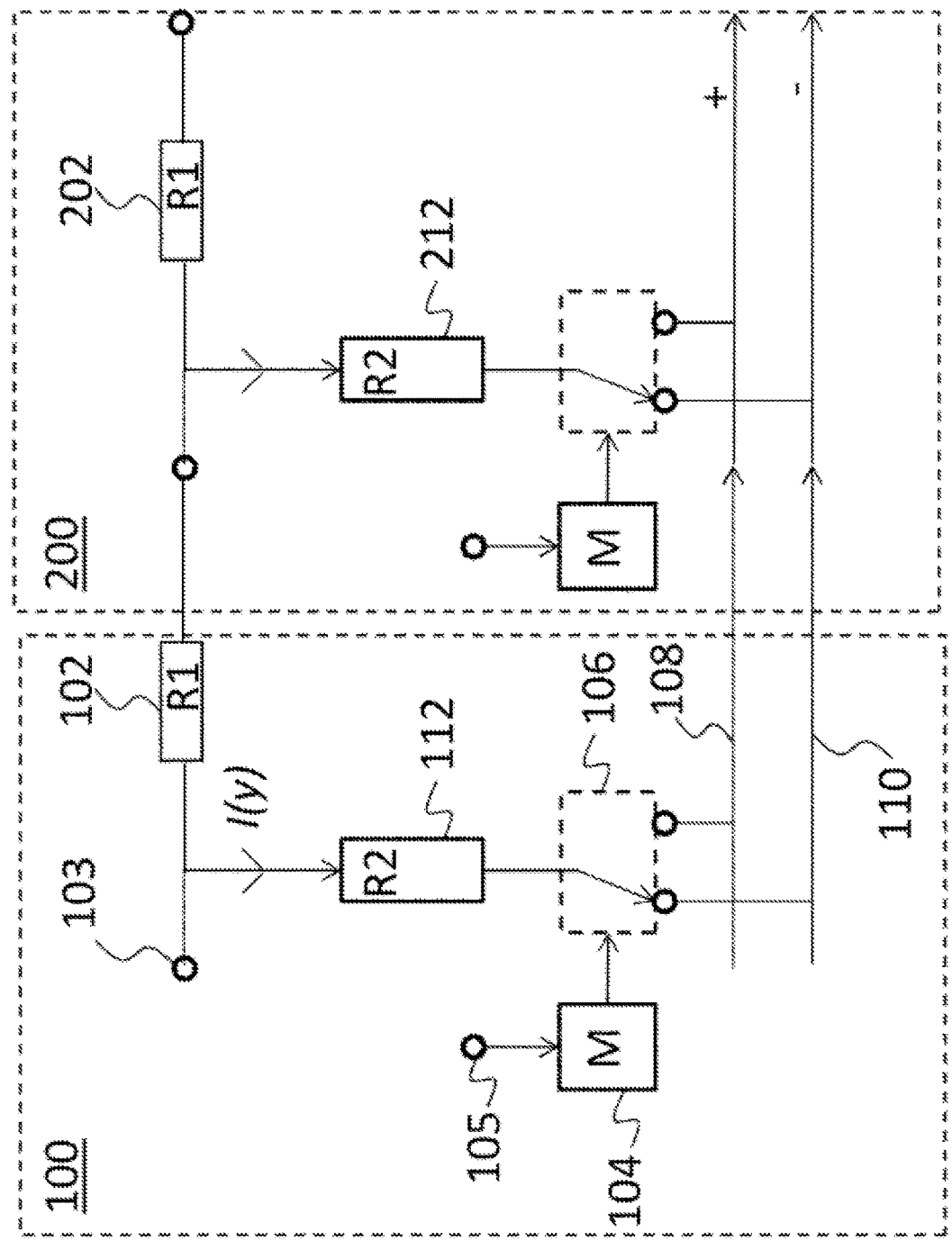
FIG. 2 is a schematic view of a plurality of the FIG. 1 basic computing elements connected in series according to some example embodiments.

As shown in FIG. 2, the basic computing element 100 shown in FIG. 1 can be connected in series (or in parallel) to other such basic computing elements 200 to provide additional coefficients for use in computing, whether it is required for multiplication, division, addition and/or subtraction and any further computational processes that make use of these basic computation types.

From now on, the first and second resistance means 102, 112 will be referred to as resistors, but it will be appreciated that such resistors do not necessarily comprise, for example, polysilicon or metal film resistors. Such polysilicon or metal film resistors can be used in the IC, although these do not offer the same density advantages as the use of resistive contacts grown using ALD.

As shown in FIG. 2, the connection of the first and second resistors 102, 112 of the basic computing element 100 to first and second resistors 202, 212 of another basic computing element 200 provides a so-called ladder resistor network, which is a known topology used for, for example, digital to analogue (DAC) multipliers. The FIG. 2 topology therefore provides two-bit coefficients and the topology can be extended even further, either in series or in parallel. To give an idea on the possible density improvement, a five-bit coefficient topology may be provided in an estimated area of 0.26 μm² for an SRAM memory cell, 0.2 μm² for a DRAM memory cell and 0.18 μm² for an MRAM memory cell.

In the future, if multiple bits may be stored in a single memory cell 104, the density may be improved even further.

The basic computing element 100 has a structure that is very area and cost efficient. It may provide 10-100 times higher density and much lower cost than current implementations due to, for example, the vertically-formed resistor network implementation that is used as multiplier. Example embodiments also use ultra-low power (10-100 times improvement compared to current CMOS digital implementations) because the multiplier is only a resistor and summing/addition may be performed in the analogue domain wherein there are no rail to rail switching gates. Very high implementation density allows parallel computation architectures that can provide high performance.

Certain practical implementation examples will now be shown and described.

Practical Implementation Examples

FIG. 3A is a schematic view of a basic computing element 300 implemented using six transistor (6T) SRAM. The basic computing element 300 follows the general configuration of that shown in FIG. 1. The basic computing element 300 may comprise first and second resistors 302, 304 (R4, R3), connected as a current divider, with a switch 306 provided at a second terminal of the second resistor for coupling current flowing through the second resistor 304 to either a summing node/bus 308 or a subtraction node/bus 310. The second resistor 304 may have twice the resistance value as the first resistor 302. The switch 306 may be provided by two transistors Q7, Q8 which can be of the same type or which can be of different types. The remaining transistors Q1-Q6 provide a memory cell 312 of the basic computing element 300. A bit line (BL) and word line (WL) indicate the column and row address lines of the basic computing element 300 to permit addressing in a row or grid-like array of such basic computing elements, and the signals provided on one or both cause enablement of said basic computing element to permit setting or resetting of the control bit. The reference #BL refers to the inverted bit line (BL) signal.

FIG. 3B is a pin or terminal diagram corresponding to the basic computing element 300 shown in FIG. 3A.

FIG. 4A is a schematic view of a basic computing element 400 implemented using four transistor (4T) SRAM. The basic computing element 400 follows the general configuration of that shown in FIG. 1. The basic computing element 400 may comprise first and second resistors 402, 404 (R4, R3), connected as a current divider, with a switch 406 provided at a second terminal of the second resistor for coupling current flowing through the second resistor 402 to either a summing node/bus 408 or a subtraction node/bus 410. The second resistor 404 may have twice the resistance value as the first resistor 402. The switch 406 may be provided by two transistors Q6, Q5 which can be of the same type or which can be of different types. The remaining four transistors Q1-Q4 and two resistors 422, 424 provide a memory cell 412 of the basic computing element 400. The use of the resistors 422, 424 (R1, R2) (being high-resistance contacts in the same way as the first and second resistors 402, 404 are implemented) may result in a smaller area than the FIG. 3A example. The resistance values of the resistors 422, 424 may be the same as that of the second resistor 404. A bit line (BL) and word line (WL) indicate the column and row address lines of the basic computing element 400 to permit addressing in a row or grid-like array of such basic computing elements, and the signals provided on both cause enablement of said basic computing element to permit setting or resetting of the control bit. The reference #BL refers to the inverted bit line (BL) signal.

FIG. 4B is a pin or terminal diagram corresponding to the basic computing element 400 shown in FIG. 4A.

Figures 5A, 5B:
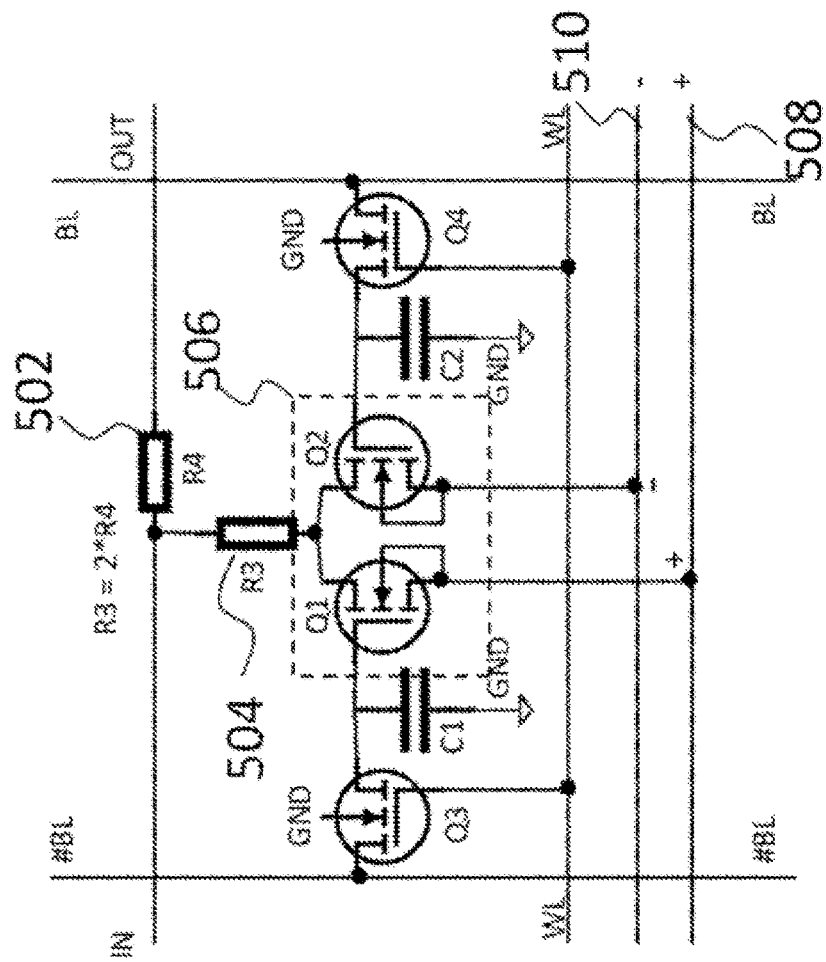
FIG. 5A is a schematic view of a basic computing element implemented using DRAM according to some example embodiments.
FIG. 5B is a pin or terminal diagram corresponding to the basic computing element 500 shown in FIG. 5A

FIG. 5A is a schematic view of a basic computing element 500 implemented using DRAM. The basic computing element 500 follows the general configuration of that shown in FIG. 1. The basic computing element 500 may comprise first and second resistors 502, 504 (R4, R3), connected as a current divider, with a switch 506 provided at a second terminal of the second resistor for coupling current flowing through the second resistor 502 to either a summing node/bus 508 or a subtraction node/bus 510. The second resistor 504 may have twice the resistance value as the first resistor 502. The switch 506 may be provided by two transistors Q1, Q2 which can be of the same type or which can be of different types. The remaining transistors Q3, Q4 provide a memory cell of the basic computing element 500 together with first and second capacitors C1, C2 being used to hold voltage to drive the switch 506 transistors Q1, Q2. Such capacitors C1, C2 will discharge due to leakage currents via the word line transistors Q3, Q4, which capacitors will need refreshing; if a high enough clock frequency is used, there may be no need to refresh the capacitors C1, C2 which may improve area efficiency, power consumption and performance. A bit line (BL) and word line (WL) indicate the column and row address lines of the basic computing element 300 to permit addressing in a row or grid-like array of such basic computing elements, and the signals provided on both cause enablement of said basic computing element to permit setting or resetting of the control bit. The reference #BL refers to the inverted bit line (BL) signal . . . >

FIG. 5B is a pin or terminal diagram corresponding to the basic computing element 400 shown in FIG. 5A.

Figures 6A, 6B:
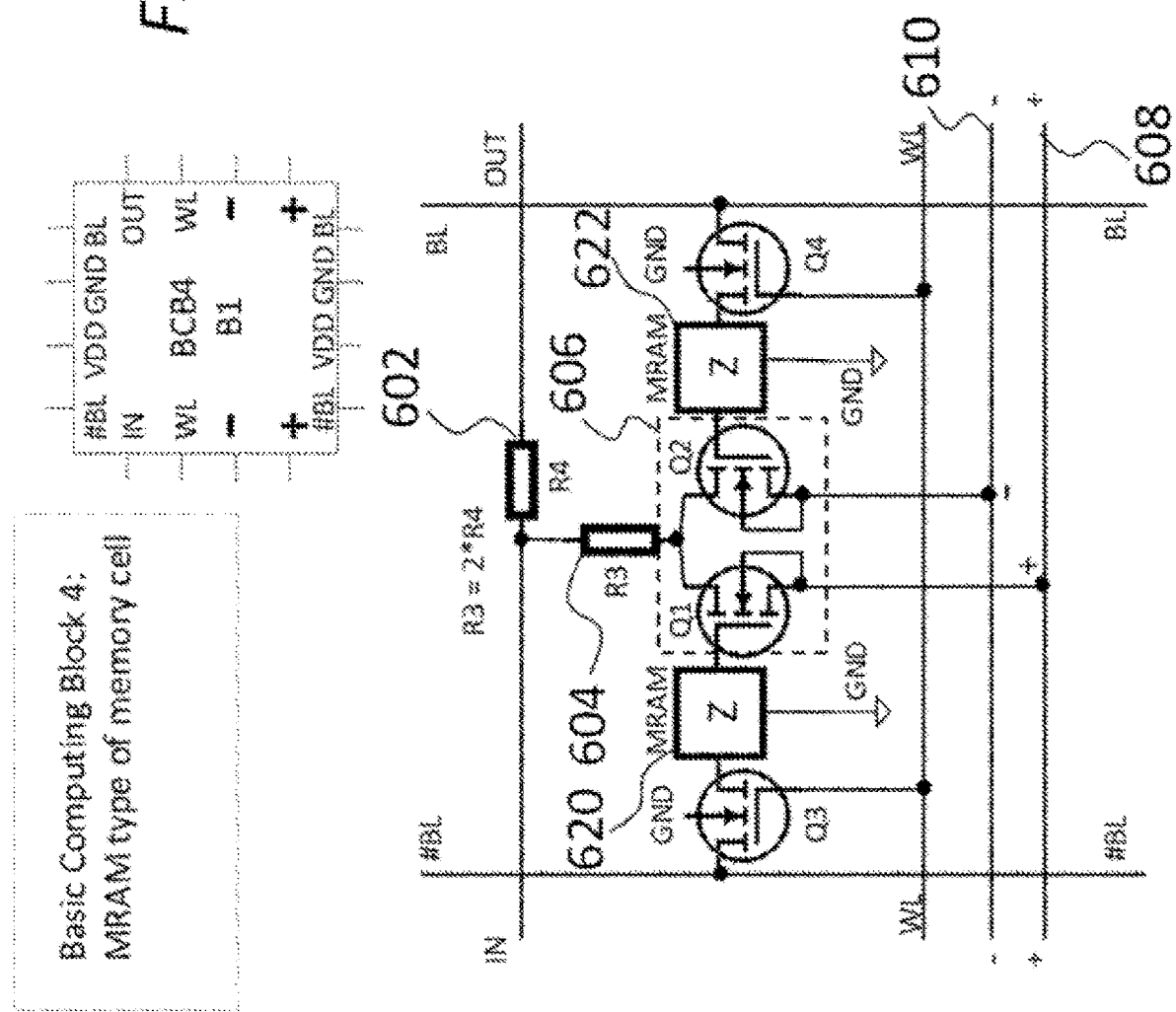
FIG. 6A is a schematic view of a basic computing element implemented using MRAM according to some example embodiments.
FIG. 6B is a pin or terminal diagram corresponding to the basic computing element 600 shown in FIG. 6A

FIG. 6A is a schematic view of a basic computing element 600 implemented using MRAM. The basic computing element 600 follows the general configuration of that shown in FIG. 1. The basic computing element 600 may comprise first and second resistors 602, 604 (R4, R3), connected as a current divider, with a switch 606 provided at a second terminal of the second resistor for coupling current flowing through the second resistor 602 to either a summing node/bus 608 or a subtraction node/bus 610. The second resistor 604 may have twice the resistance value as the first resistor 602. The switch 606 may be provided by two transistors Q1, Q2 which can be of the same type or which can be of different types. The remaining transistors Q3, Q4 provide a memory cell of the basic computing element 600 together with first and second MRAM memory bit-cells 620, 622 to control the switch 606 transistors Q1, Q2. The MRAM memory bit cells 620, 622 may be implemented between metal layers of the IC and may provide a very dense implementation. A bit line (BL) and word line (WL) indicate the column and row address lines of the basic computing element 600 to permit addressing in a row or grid-like array of such basic computing elements, and the signals provided on both cause enablement of said basic computing element to permit setting or resetting of the control bit. The reference #BL refers to the inverted bit line (BL) signal.

FIG. 6B is a pin or terminal diagram corresponding to the basic computing element 400 shown in FIG. 5A.

Figure 7:
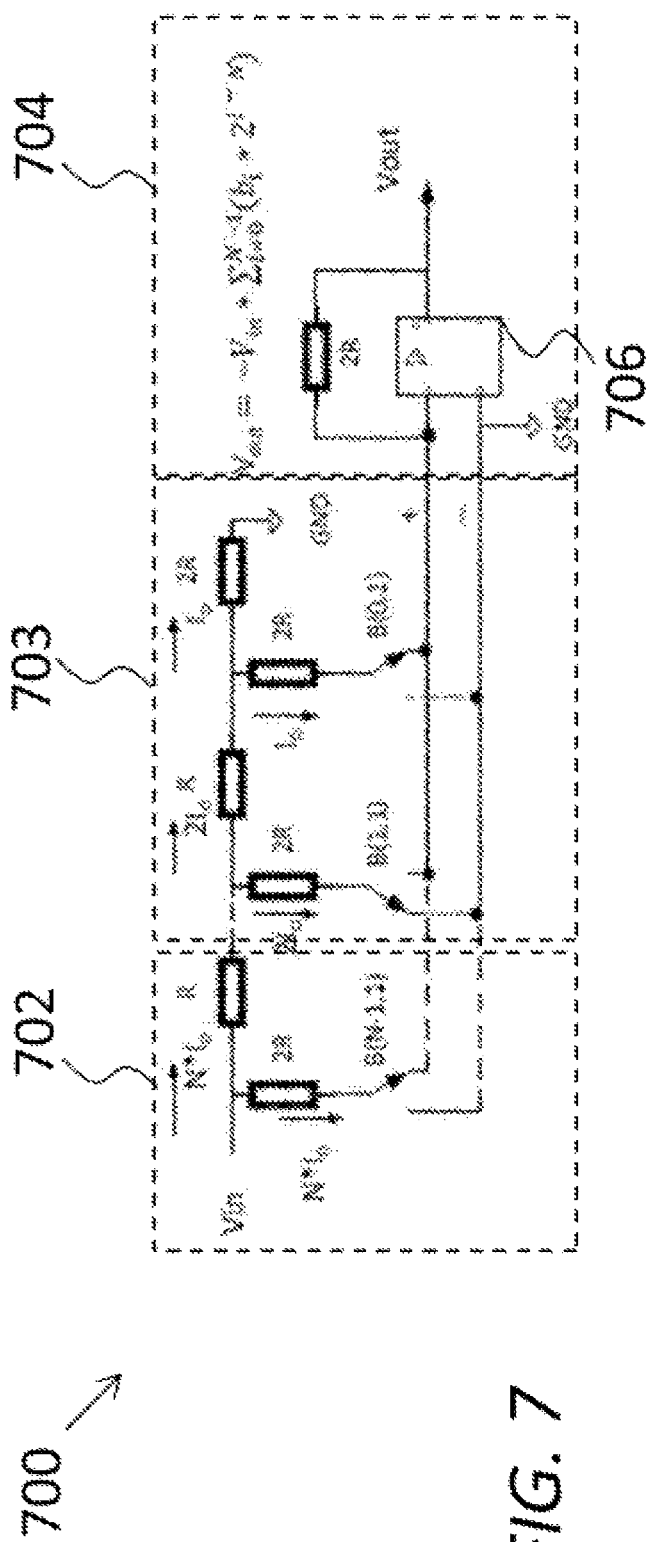
FIG. 7 is a schematic view of an N-bit multiplier using two or more of basic computing elements, according to some example embodiments.

FIG. 7 is a schematic view of an N-bit multiplier 700 using two or more of any one of the above basic computing elements 300, 400, 500, 600. As will be appreciated, the first portion 702 of the multiplier represents the most significant bit (MSB) whereas the second portion 703 represents, in this example, the least two significant bits (LSB.) Zero, or any number of intermediate current dividers may be provided between the first and second portions 702, 703. The third portion 704 represents an analogue signal processing portion comprising an operational amplifier 706 which generates an analogue representation of the multiplied signal dependent on the switch positions which are determined by the respective control bits applied, and which of the summing and subtraction nodes of the operation amplifier the signals are provided to. It may therefore be referred to also as an N-bit multiplying digital-to-analogue converter (DAC.)

The N-bit multiplier 700 implemented using the above basic computing elements 300, 400, 500, 600 whereby high resistivity contacts and a switch combined with the memory cell will provide a very dense structure on an IC and require only a very small area.

Figure 8:
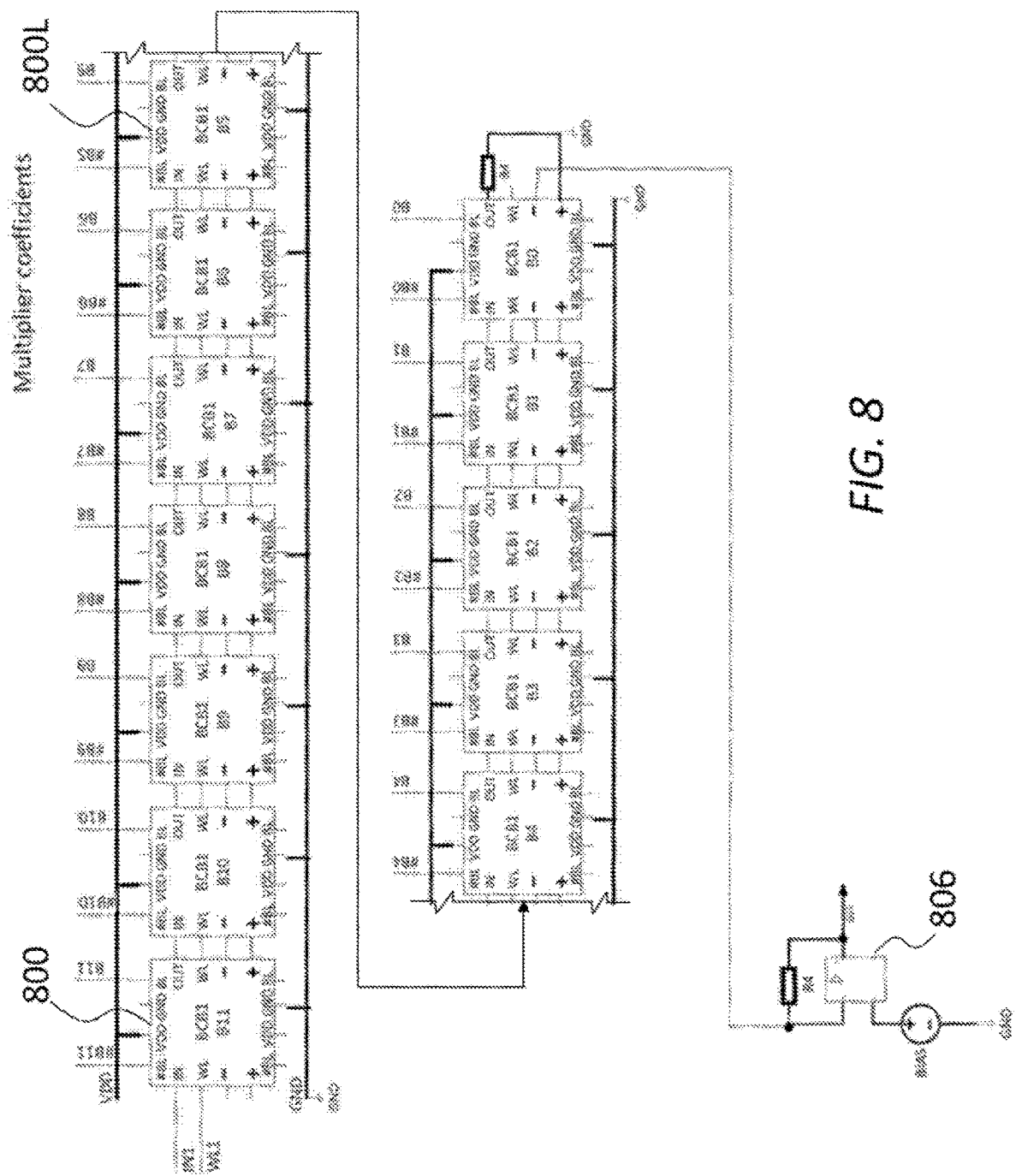
FIG. 8 is a schematic view of how the FIG. 7 implementation may be realised by connecting in series multiple basic computing elements according to some example embodiments.

FIG. 8 is a schematic diagram of how the FIG. 7 implementation may be realised by connecting in series multiple basic computing elements 800, in this case multiple 6T SRAM cells shown in FIG. 3A, and connecting the output of the LSB basic computing element 800L to an operational amplifier 806.

Figure 9:
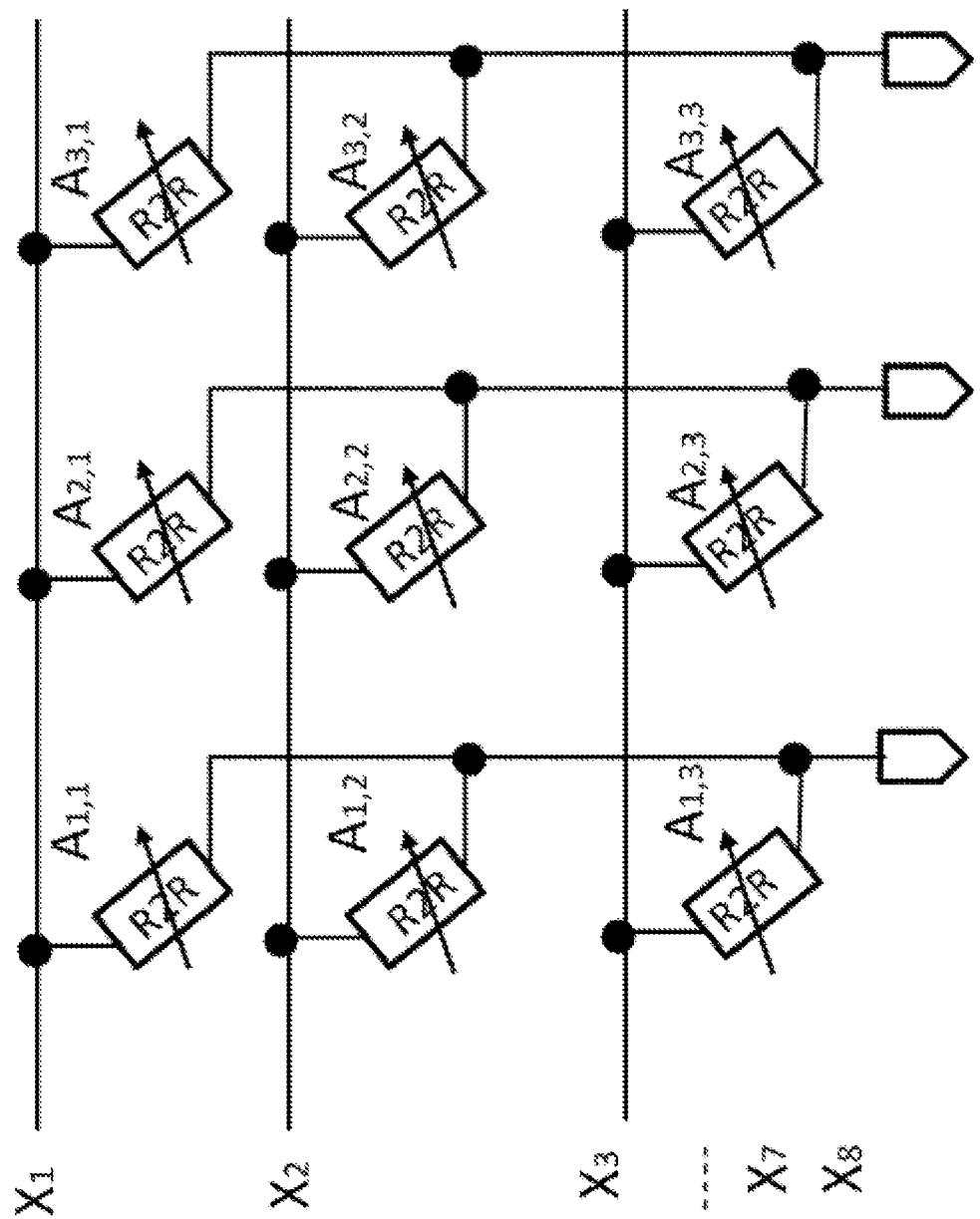
FIG. 9 is a schematic view of how multiple R-2R strings may be connected in a grid-like manner to provide a matrix-vector multiplier according to some example embodiments.

FIG. 9 is a schematic diagram of how multiple R-2R strings may be connected in a grid-like manner to provide a matrix-vector multiplier which may perform equations such as:

$$\begin{pmatrix} A_{1,1}A_{1,2}A_{1,3} & \ldots & A_{1,7}A_{1,8} \\ A_{2,1}A_{2,2}A_{2,3} & \ldots & A_{2,7}A_{2,8} \\ A_{3,1}A_{3,2}A_{2,3} & \ldots & A_{3,7}A_{3,8} \\ \ldots & \ldots & \ldots \\ A_{31,1}A_{31,2}A_{31,3} & \ldots & A_{31,7}A_{31,8} \\ A_{32,1}A_{32,2}A_{32,3} & \ldots & A_{32,7}A_{32,8} \end{pmatrix} \begin{pmatrix} X_1 \\ x_2 \\ x_3 \\ \ldots \\ x_7 \\ x_8 \end{pmatrix} =$$

$$\begin{pmatrix} A_{1,1}X_1 + A_{1,2}X_2 + A_{1,3}X_3 & \ldots & +A_{1,7}X_7 + A_{1,8}X_8 \\ A_{2,1}X_1 + A_{2,2}X_2 + A_{2,3}X_3 & \ldots & +A_{2,7}X_7 + A_{2,8}X_8 \\ A_{3,1}X_1 + A_{3,2}X_2 + A_{3,3}X_3 & \ldots & +A_{3,7}X_7 + A_{3,8}X_8 \\ \ldots & \ldots & \ldots \\ A_{31,1}X_1 + A_{31,2}X_2 + A_{31,3}X_3 & \ldots & +A_{31,7}X_7 + A_{31,8}X_8 \\ A_{32,1}X_1 + A_{32,2}X_2 + A_{32,3}X_3 & \ldots & +A_{32,7}X_7 + A_{32,8}X_8 \end{pmatrix}$$

In FIG. 9, an adjustable multiplier coefficient may be implemented with a similar R-2R network as in the multiplying DAC shown in FIG. 7. For each branch, there may be provided multiple R-2R networks that are connected to the same branch and the operational amplifier may sum currents coming from separate branches.

Figure 10:
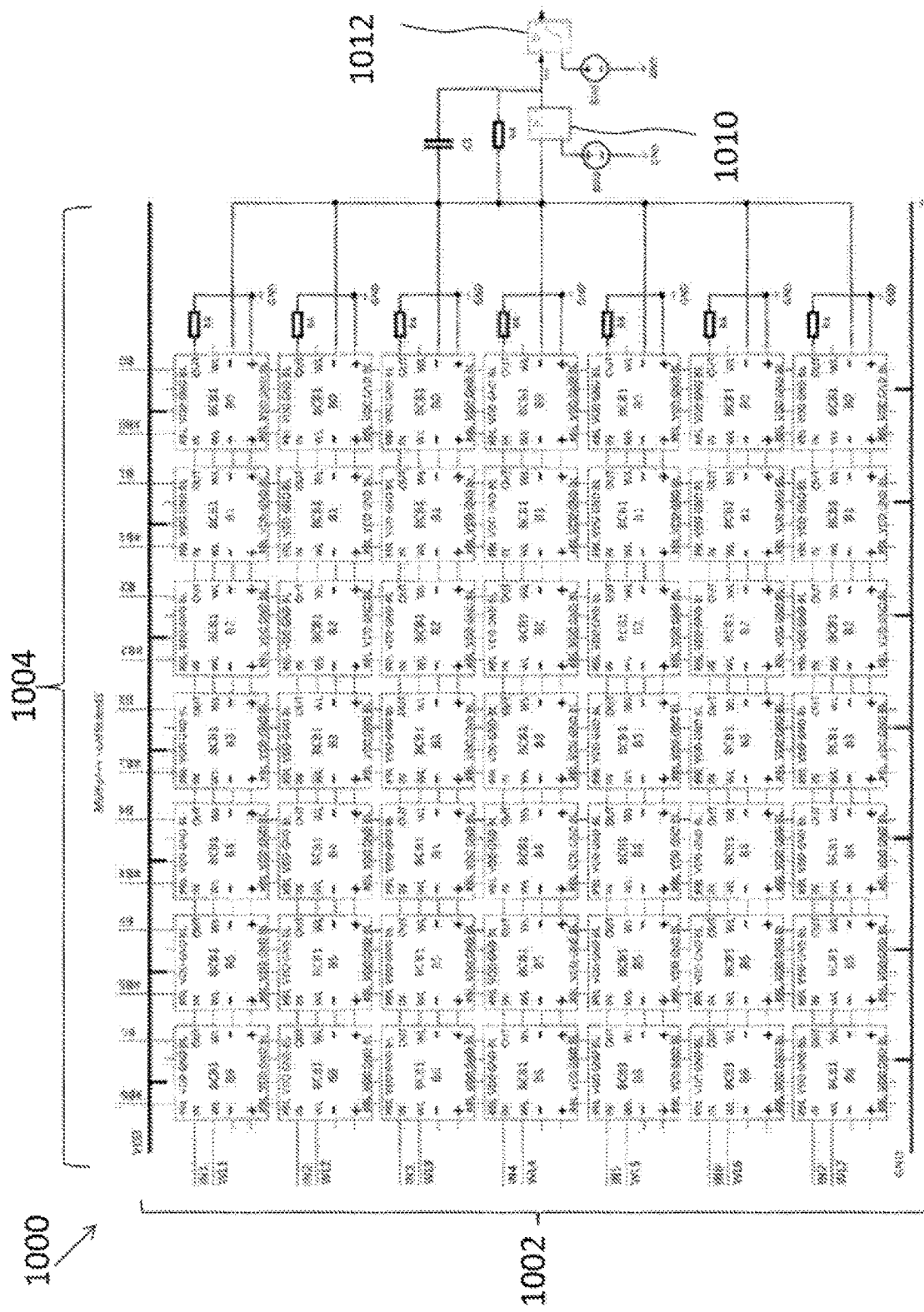
FIG. 10 is a schematic view of how a neural network may be implemented using a grid-like arrangement of basic computing elements according to some example embodiments.

FIG. 10 is a schematic view of how a neural network 1000 may be implemented using a grid-like arrangement of basic computing elements 300, 400, 500, 600 using any of the above types. In FIG. 10, the neural network 100 comprises seven inputs 1002 and seven-bit coefficients 1004. There is also provided an integrating amplifier 1010 and activation function with a thresholding bias 1012, both in the analogue domain.

To build neural networks, weight multiplications between nodes (sometimes called the transition function) should be area and energy-efficient and have high performance. Example embodiments enable such advantages by virtue of the basic computing element, capable of multiplication, having approximately the same area as a storage cell. Energy efficiency is achieved by the multiplication happening in the resistor network, in the analogue domain, and there may be no rail-to-rail switching elements as in digital multipliers. Computing speed is improved when computation happens in parallel.

FIGS. 11A and 11B are schematic view of neural network topologies that may be implemented using example embodiment methodologies; specifically, where multiplier coefficients do not need to be programmed, but instead may comprise fixed coefficients, no storage cells or switches are needed, and so the contact resistors are the only elements in the multiplier. Accuracy is defined by the R and 2R matching, resulting in a simple implementation. A neural network compiler may be developed to compile such networks using library components.

Figure 12A:
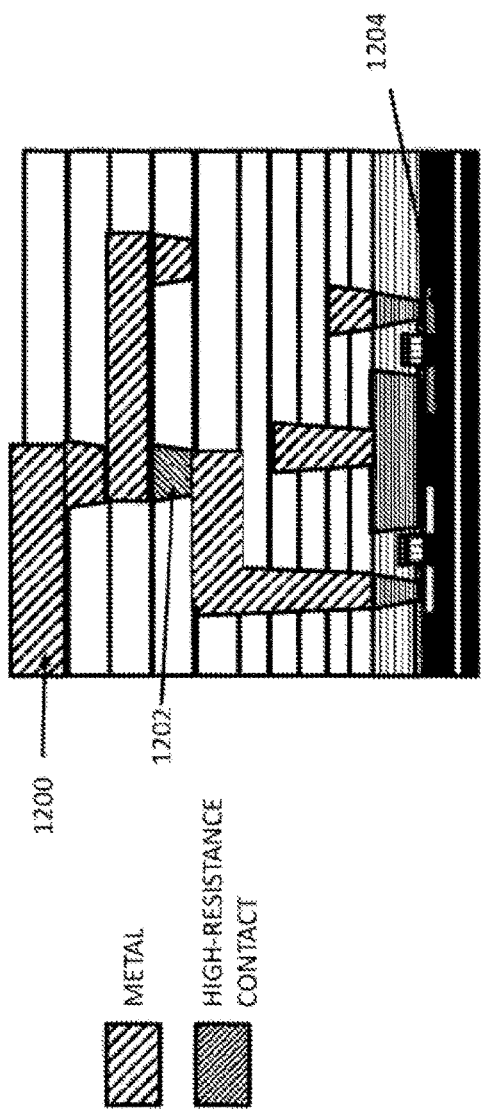
FIG. 12A is a cross-sectional view of part of an integrated circuit which may implement either of the FIG. 11A or 11B topologies, provided according to some example embodiments.

FIG. 12A is a cross-sectional view of part of an IC which may implement either of the FIG. 11A or 11B topologies. It will be seen that it provides a very dense implementation, involving metal layers 1200 stacked on top of one another with the resistor contacts 1202 occupying very small areas as they pass through one layer, between spaced-apart layers. In this example embodiment, the implementation requires no storage cell and no switches, using only resistor contacts. If a single contact 1202 has the value of R, for example, providing an N-bit implementation will involve a contact area of 3N, so, for example, seven bits will require an area of twenty one contacts. This shows how example embodiments can provide very large and dense neural networks. Where CMOS transistors are present, these can be provided where indicated by reference numeral 1204.

As well as fixed, already-trained neural networks, having no switches and storage cells and perhaps trained for a particular task using only resistors, other embodiments may provide a mix of fixed and flexible implementations and fully flexible implementations. For example, a fixed and flexible neural network implementation may involve some switches and storage cells, wherein some resistor values provide multiplier coefficients and connections are fixed. Such a neural network may be for a specific task but may adapt, e.g. for speech recognition that adapts to the user. A fully flexible neural network implementation may involve some switches and storage cells also, but whereby all resistor values provide the multiplier coefficients and connections are also programmable. Such a neural network may be used for training.

Other uses of the basic computing element introduced herein may be for other computing applications, such as in DFT and DCT computation. DCT is a basic function in image and video processing, and example embodiments therefore offer potential usage in real-time image processing systems, as well as in communications and speech processing systems.

Figure 12B:
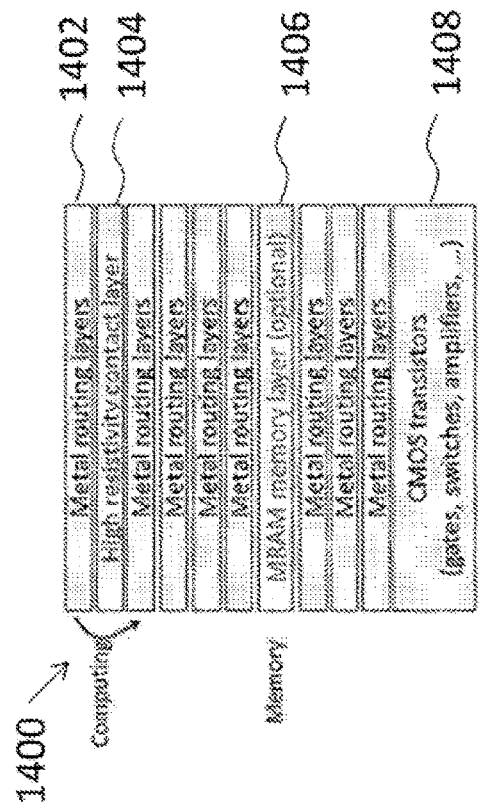
FIG. 12B is another cross-sectional view of a three-dimensional integrated circuit implementation, provided according to some example embodiments.

FIG. 12B is a cross-sectional view of a three-dimensional IC implementation 1400 according to example embodiments. It will be seen that the implementation involves fabrication using multiple layers, including a plurality of metal layers 1402, at least one high-resistivity contact layer 1404, an optional MRAM memory layer 1406, and one or more layers comprising MOS transistors, e.g. CMOS transistors which may comprise gates, switches, amplifiers etc. and may include analogue domain components. The one or more high-resistivity contact layers may be provided by one or more vias. Such a layer or layers may be grown through ALD to achieve high uniformity and controllability. There may be provided more than one high-resistivity layer but usually this may be not needed because the area occupied by the resistors is smaller than the active devices in silicon. In fixed networks, several layers could be used to increase the area efficiency e.g. multiple fixed R-2R layers on top of one another.

If MRAM, OxRAM, or RRAM-type memories are available as part of the manufacturing process, these can be formed in the FIG. 12B-type structure to provide even better area efficiency than with SRAM-type structures. These new non-volatile memories are very attractive in applications where the coefficients need to be programmable and their value retained when powered off. A neural network implementation requiring adaptiveness could utilize this kind of structure. One example could be a pre-trained natural language system, where the neural network is trained for a certain language, e.g. French, but the neural network could adapt to the speaker's speech whilst it is used. This could be used in applications to improve user recognition and even security, for example.

Figure 13:
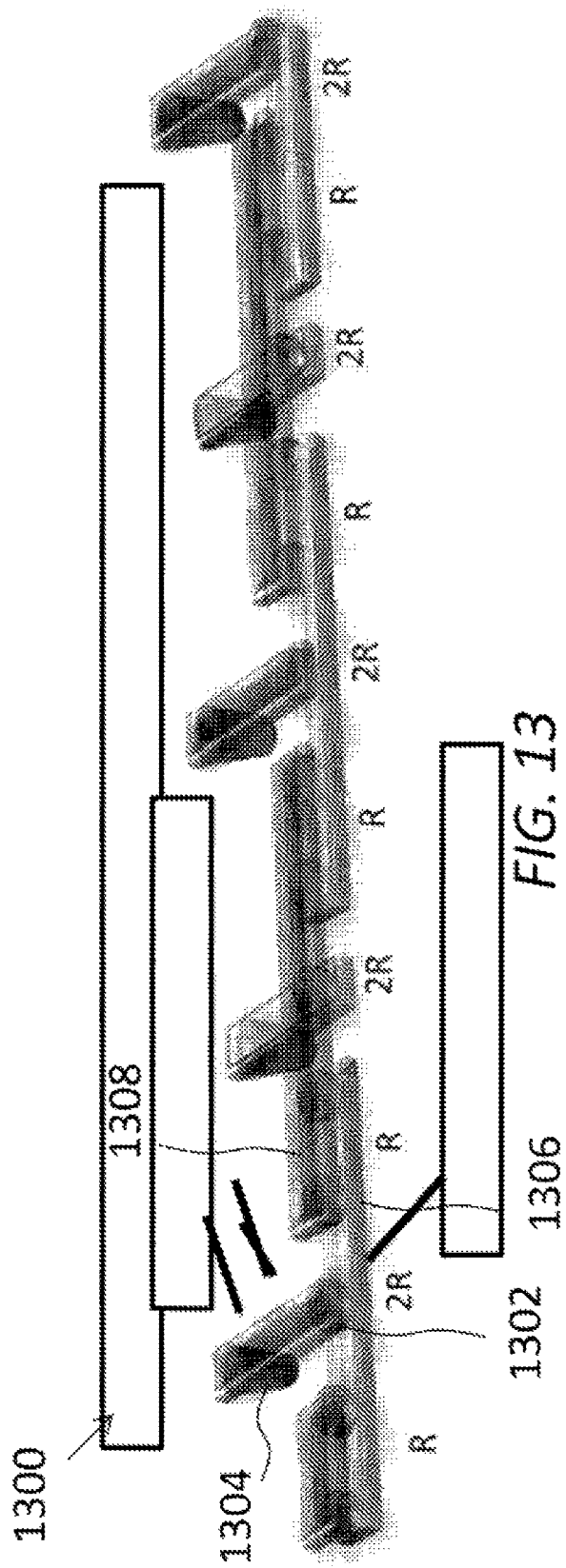
FIG. 13 is a perspective view of two layers of an integrated circuit, implementing a R-2R resistor ladder 1300, provided according to some example embodiments.

FIG. 13 is a perspective view of two layers of an IC implementing a R-2R resistor ladder 1300, by way of example, to show how high-resistance contacts 1302 extending vertically from a first metal layer 1306 to a second metal layer 1308 may provide the resistance values. Note that a single contact 1302 has the value 2R and so some parts (labelled R) use two such resistive contacts in parallel to achieve good matching. Contacts indicated by reference numeral 1304 are low-resistance 'via' contacts.

For example, the metal layers 1306, 1308 may be transition oxide metals (TMOs) and the resistive contacts may be of any suitable material, for example grown using ALD processes using ultra-thin $Al_2O_{3-y}$ layers on $TiO_{2-x}$. Other materials may be used.

FIG. 14A is a schematic diagram of how basic computing elements 1402 may be used to form an R-string with high resistivity contacts, as described above, and fabricated in the same way. This configuration uses a high resistivity resistor string. A switch 1406 is connected in parallel with each resistor 1404 of the resistor string and this switch can shunt (short circuit) the resistor so the total resistance depends on number of switches that are closed (ON or conductive) and the control is stored in memory cell 1408. FIG. 14B is another schematic diagram which is similar to FIG. 14A but employs DRAM memory cells. FIG. 14C shows another string embodiment where the high resistivity resistor string is used in DAC. A Vref voltage is divided by the resistor string and a suitable output voltage is selected from the right tap-point by the selection switch. The content of one particular memory bit has a control value that turns that switch on. This configuration can be used in resistor string DACs and this is suitable for slower speed, ultra-low power applications.

It is to be understood that what is described above is what is presently considered the preferred embodiments. However, it should be noted that the description of the preferred embodiments is given by way of example only and that various modifications may be made without departing from the scope as defined by the appended claims.

The invention claimed is:

1. An integrated circuit comprising:
a resistive network comprising:
a first resistance element having a first resistance value and a second resistance element having a second resistance value, the first resistance element and the second resistance element of the resistive network being provided by one or more high-resistance contacts positioned between conductors of the integrated circuit, wherein a switch is connected in parallel with respective ones of the first resistance element and the second resistance element, wherein the one or more high-resistance contacts are positioned in order to (i) obtain a higher resistance value from the first resistance element and the second resistance element than an on-resistance of switching transistors or (ii) satisfy a predetermined threshold with the first resistance value and the second resistance value, and wherein the first resistance value and the second resistance value are dependent on whether the switch is closed or open;
a memory cell for storing at least one bit of data; and
a write node via which the memory cell is reset,
wherein the resistive network has a summing node output and a subtraction node output, and
wherein the integrated circuit is configured such that an electrical current from the resistive network to one of the summing node output or the subtraction node output is input to a corresponding summing node input or a subtraction node input of a signal processing component.

2. The integrated circuit of claim 1, wherein the resistive network is configured as a current or voltage divider.

3. The integrated circuit of claim 1, wherein each of the first resistance element and the second resistance element is comprised of one or more resistive contacts formed by atomic layer deposition (ALD) of material to provide the one or more high-resistance contacts between the conductors.

4. The integrated circuit of claim 1, wherein the resistive network is configured as a current divider and the second resistance value is an integer multiple of the first resistance value.

5. The integrated circuit of claim 1, wherein the second resistance value is a value that is twice that of the first resistance value.

6. The integrated circuit of claim 5, wherein the high-resistance contacts have equivalent resistance values, the first resistance element comprising two or more high-resistance contacts connected in parallel to provide the same resistance as one high-resistance contact forming a second resistor unit.

7. The integrated circuit of claim 1, further configured to:
store in the memory cell an electrical signal representing at least one control bit; and
route, via a semiconductor switch, the electrical current from the resistive network to one of the summing node output or the subtraction node output based on the value of the at least one control bit.

8. The integrated circuit of claim 7 wherein the memory cell comprises one of a Static Random-Access Memory (SRAM), Dynamic Random-Access Memory (DRAM), Magnetoresistive Random Access Memory (MRAM), Resistive Random-Access Memory (RRAM), Ferromagnetic Random-Access Memory (FRAM), Non-volatile Memory (NVM) Flash, or Oxide based Random Access Memory (OxRAM) memory cell implemented on the integrated circuit.

9. The integrated circuit of claim 7 further comprises, for routing, the semiconductor switch comprising first and second transistors, the value of the control bit determining the state of the semiconductor switch.

10. The integrated circuit of claim 1, wherein the integrated circuit is configured to be used in Digital Fourier Transform (DFT) Conversions, Fast Fourier Transform (FFT) Conversions, Discrete Cosine Transform (DC T) conversions, digital-to analogue converters or successive approximation ratio (SAR) analogue-to-digital converters.

11. The integrated circuit of claim 1, wherein the memory cell is configured to provide coefficients for use in computing.

12. The integrated circuit of claim 11, wherein the coefficients are configured to be used in multiplication, division, addition and/or subtraction computational processes.

13. A system, comprising:
a plurality of integrated circuits that respectively comprise:
a resistive network comprising a first resistance element having a first resistance value and a second resistance element having a second resistance value, the first resistance element and the second resistance element of the resistive network being provided by one or more high-resistance contacts positioned between conductors of the respective integrated circuit, wherein a length of the second resistance element is twice a length of the first resistance element, wherein the one or more high-resistance contacts are positioned in order to (i) obtain a higher resistance value from the first resistance element and the second resistance element than an on-resistance of switching transistors or (ii) satisfy a predetermined threshold with the first resistance value and the second resistance value, wherein the resistive network has a summing node output and a subtraction node output;

a memory cell for storing at least one bit of data; and a write node via which the memory cell is set or reset, wherein the plurality of integrated circuits are configured as current dividers and are connected in series with the current dividers being connected to provide a resistor ladder, and wherein the memory cells associated with the respective integrated circuits are configured to receive as input a respective control bit.

14. The system according to claim 13, wherein the memory cells associated with the respective integrated circuits are configured to provide coefficients for use in computing.

15. The system according to claim 14, wherein the coefficients are configured to be used in multiplication, division, addition and/or subtraction computational processes.

16. The system of claim 13, further comprising an analogue signal processing component having a summing node input and a subtraction node input for receiving routed electrical currents from the respective summing node outputs and subtraction node outputs of the series-connected plurality of integrated circuits to provide at least a multiplier function.

17. The system of claim 16, wherein the analogue signal processing component comprises an operational amplifier.

18. The system of claim 13, the system being arranged to implement at least part of a neural network in which the control bits stored by the memory cells of the series-connected plurality of integrated circuits represent multiplier coefficients.

19. A method, comprising:

providing in an integrated circuit a resistive network comprising:

a first resistance element having a first resistance value and a second resistance element having a second resistance value, the first resistance element and the second resistance element of the resistive network being provided by one or more high-resistance contacts positioned between conductors of the integrated circuit, wherein a switch is connected in parallel with respective ones of the first resistance element and the second resistance element, wherein the one or more high-resistance contacts are positioned in order to (i) obtain a higher resistance value from the first resistance element and the second resistance element than an on-resistance of switching transistors or (ii) satisfy a predetermined threshold with the first resistance value and the second resistance value, and wherein the first resistance value and the second resistance value are dependent on whether the switch is closed or open;

a memory cell for storing at least one bit of data; and a write node via which the memory cell is set or reset, wherein the resistive network has a summing node output and a subtraction node output; and providing in the integrated circuit an electrical current from the resistive network to one of the summing node output or the subtraction node output of the resistive network for input to a corresponding summing node input or a subtraction node input of a signal processing component.

20. The method of claim 19, wherein the first and second resistance elements are provided by an atomic deposition layer technique between two conductors which are provided as conductive layers of the integrated circuit.

* * * * *

UNITED STATES PATENT AND TRADEMARK OFFICE
CERTIFICATE OF CORRECTION

| | | |
|---|---|---|
| PATENT NO. | : 12,136,005 B2 | Page 1 of 1 |
| APPLICATION NO. | : 16/892981 | |
| DATED | : November 5, 2024 | |
| INVENTOR(S) | : Kim Kaltiokallio | |

It is certified that error appears in the above-identified patent and that said Letters Patent is hereby corrected as shown below:

On the Title Page

In Column 1, item (30), Foreign Application Priority Data, Line 1, delete "19179656" and insert -- 19179656.4 --, therefor.

In the Claims

In Column 14, Line 48, Claim 10, delete "(DC T)" and insert -- (DCT) --, therefor.

In Column 14, Line 49, Claim 10, delete "digital-to analogue" and insert -- digital-to-analogue --, therefor.

Signed and Sealed this
Fourteenth Day of January, 2025

Derrick Brent
*Acting Director of the United States Patent and Trademark Office*